United States Patent
Liang et al.

(10) Patent No.: US 11,956,611 B2
(45) Date of Patent: Apr. 9, 2024

(54) BAROMETRIC VENT STACK-UP DESIGN TO IMPROVE WATER PERFORMANCE

(71) Applicant: Apple Inc., Cupertino, CA (US)

(72) Inventors: Jiahui Liang, San Francisco, CA (US); Kahn C. Wu, San Francisco, CA (US); Stephen L. Frey, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/380,940

(22) Filed: Jul. 20, 2021

(65) Prior Publication Data

US 2022/0095055 A1 Mar. 24, 2022

Related U.S. Application Data

(60) Provisional application No. 63/083,066, filed on Sep. 24, 2020.

(51) Int. Cl.
| | | |
|---|---|---|
| *H04R 7/06* | (2006.01) | |
| *H04R 1/02* | (2006.01) | |
| *H04R 7/18* | (2006.01) | |
| *H04R 9/02* | (2006.01) | |
| *H04R 9/06* | (2006.01) | |
| *H05K 5/02* | (2006.01) | |

(52) U.S. Cl.
CPC .............. *H04R 7/06* (2013.01); *H04R 1/025* (2013.01); *H04R 7/18* (2013.01); *H04R 9/025* (2013.01); *H04R 9/06* (2013.01); *H05K 5/0213* (2013.01); *H05K 5/0215* (2022.08); *H04R 2400/11* (2013.01)

(58) Field of Classification Search
CPC . H04R 7/06; H04R 1/025; H04R 7/18; H04R 9/025; H04R 9/06; H04R 2400/11; H05K 5/0215
See application file for complete search history.

(56) References Cited

U.S. PATENT DOCUMENTS

| | | | |
|---|---|---|---|
| 2004/0165744 A1 | 8/2004 | Tsumori et al. | |
| 2010/0045949 A1* | 2/2010 | Nakano | G03F 7/70341 355/30 |
| 2012/0034109 A1* | 2/2012 | Tout | F04B 43/046 417/313 |
| 2015/0163572 A1* | 6/2015 | Weiss | H04R 1/2876 381/337 |
| 2016/0165327 A1* | 6/2016 | Crosby | H04R 1/2811 381/332 |

(Continued)

FOREIGN PATENT DOCUMENTS

| | | |
|---|---|---|
| CN | 1353561 A | 6/2002 |
| CN | 207937914 U | 10/2018 |

(Continued)

*Primary Examiner* — Michael A Matey
(74) *Attorney, Agent, or Firm* — Dorsey & Whitney LLP

(57) ABSTRACT

A portable electronic device can include a housing at least partially defining an internal volume. The device can include a venting module including a membrane, a porous member, and a support structure. The membrane and porous member can define a fluid path extending a width of the porous member and placing the internal volume in fluid communication with an ambient environment adjacent the housing. The support structure can be coupled to the porous member.

20 Claims, 5 Drawing Sheets

(56) References Cited

U.S. PATENT DOCUMENTS

| | | | |
|---|---|---|---|
| 2016/0353186 A1* | 12/2016 | Rothkopf | G04G 21/02 |
| 2017/0089698 A1* | 3/2017 | Ehman | G01C 5/06 |
| 2017/0089795 A1* | 3/2017 | Perkins | G01L 19/0672 |
| 2017/0181303 A1* | 6/2017 | Li | B29C 45/1671 |
| 2018/0063634 A1* | 3/2018 | Dave | H04R 1/023 |
| 2019/0082547 A1* | 3/2019 | Werner | H05K 5/0213 |
| 2020/0073338 A1* | 3/2020 | Liang | G04G 21/08 |
| 2020/0084539 A1 | 3/2020 | Lippert et al. | |
| 2020/0329289 A1* | 10/2020 | Kenaley | H04R 1/02 |
| 2020/0382861 A1* | 12/2020 | Hrudey | H04R 7/16 |
| 2022/0095024 A1* | 3/2022 | Liang | H04R 1/44 |
| 2022/0269221 A1 | 8/2022 | Liang et al. | |

FOREIGN PATENT DOCUMENTS

| | | |
|---|---|---|
| CN | 109196882 A | 1/2019 |
| CN | 210052026 U | 2/2020 |

* cited by examiner

BAROMETRIC VENT STACK-UP DESIGN TO IMPROVE WATER PERFORMANCE

CROSS-REFERENCE TO RELATED APPLICATION(S)

This claims priority to U.S. Provisional Patent Application No. 63/083,066, filed 24 Sep. 2020, and entitled "BAROMETRIC VENT STACK-UP DESIGN TO IMPROVE WATER PERFORMANCE," the entire disclosure of which is hereby incorporated by reference.

FIELD

The described embodiments relate generally to electronic devices. More particularly, the present embodiments relate to venting electronic devices.

BACKGROUND

Recent advances in electronics have driven electronic devices to encompass smaller form factors while providing increased battery life, performance, and durability. These attributes have contributed to electronic devices, such as smartwatches, which are portable and used in a variety of activities, such as, swimming, travel, exercise, scuba-diving, mountain climbing, backpacking, snorkeling, camping, fishing, biking, and other activities. Indeed, portable electronic devices provide instantaneous resources related to indoor and outdoor activities, such as, monitoring or measuring heartrate, location information, atmospheric pressure, and the like. While portable electronic devices are desirable in a broad range of activities, attributes of the environment in which the portable electronic device is used like temperature, humidity, and pressure can significantly impact the performance and functionality of electronic components within the portable electronic device. Thus, improvements and advances to portable electronic devices can be desirable to withstand environmental attributes without inhibiting the functionality of the electronic device.

SUMMARY

According to some aspects of the present disclosure, an electronic device can include a housing defining an internal volume, and a venting module in fluid communication with the internal volume. The venting module can include a membrane and a porous member. The porous member can be disposed relative to the membrane. The membrane and the porous member can provide a fluid path spanning a width of the porous member and extending from the internal volume to an ambient environment external to the housing.

In some examples, the fluid path defined by the membrane and the porous member can include a tortuous path. The membrane and the porous member can define a gap between the membrane and the porous member. The gap can be between 10 microns and 50 microns. The porous member can reduce inelastic or plastic deformation of the membrane while the membrane is biased into contact with the porous member. The porous member can include at least one of a metal, a metal alloy, a polymer, or a ceramic. The porous member can include at least one of nickel or titanium. The porous member can be a metal foam. The porous member can define a surface treated with a material that renders the porous member at least one of hydrophobic, oleophobic, or corrosion-resistant. The porous member can have a stiffness between 100 megapascals (MPa) and 300 MPa. The membrane can be affixed to a surface of the porous member. The electronic device can be a smartwatch or a smartphone. The venting module can be part of an audio component of the electronic device. The audio component can be a speaker assembly or a microphone assembly. The porous member can have a porosity of between 40% and 60%.

In some examples, a portion of the fluid path extending through the porous member can include a tortuous path. The fluid path can span the width and a length of the porous member. The venting module can also include a mount coupled to the porous member. The membrane can be affixed to the mount using, for example, a heat activated film. The venting module can also include a support structure coupled to the porous member. The electronic device can also include a pressure sensor and a display. In some examples, the porous member can define a surface and the surface can be at least one of hydrophobic, oleophobic, or corrosion-resistant.

According to some examples, a speaker assembly can include a frame, a support structure coupled to the frame and defining and aperture, a magnet affixed to the frame, and a diaphragm positioned within the aperture. The diaphragm can include a porous membrane and a porous member disposed relative to the porous membrane. The porous member can include a surface having a length and a width defining a surface area. The porous membrane and the porous member can define a fluid path extending through the surface.

In some examples, the width of the porous member can be less than a width of the porous membrane. The diaphragm can also include a mount coupled to the support structure. The diaphragm can span at least a portion of the aperture. The mount can be overmolded to the porous member.

In some examples, the fluid path defined by the membrane and the porous member can be tortuous. The membrane and the porous member can form a gap between the membrane and the porous member. The gap can be between 10 microns and 50 microns. The porous member can reduce plastic deformation of the membrane while the membrane is biased into contact with the porous member. The porous member can include at least one of a metal, a metal alloy, a polymer, or a ceramic. The porous member can include titanium. The porous member can be a metal foam. The porous member can define a surface treated with a material that renders the porous member at least one of hydrophobic, oleophobic, or corrosion-resistant. The porous member can have a stiffness between 100 megapascals (MPa) and 300 MPa. The membrane can be affixed to a surface of the porous member. The porous member can have a porosity of between 40% and 60%.

According to some aspects, a venting module can include a fluid permeable layer (e.g., porous membrane) and a fluid permeable member (e.g., porous member) disposed parallel to the membrane. The membrane and porous member can define a tortuous fluid path.

In some examples, the fluid path defined by the membrane and the porous member can be tortuous. The membrane and the porous member can form a gap between the membrane and the porous member. The gap can be between 10 microns and 50 microns. The porous member can reduce plastic deformation of the membrane while the membrane is biased into contact with the porous member. The porous member can include at least one of a metal, a metal alloy, a polymer, or a ceramic. The porous member can include titanium. The porous member can be a metal foam. The porous member can define a surface treated with a material that renders the porous member at least one of hydrophobic, oleophobic, or corrosion-resistant. The porous member can have a stiffness between 100 megapascals (MPa) and 300 MPa. The membrane can be affixed to a surface of the porous member. The porous member can have a porosity of between 40% and 60%. The fluid permeable member can include a metal, for example, titanium or nickel.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
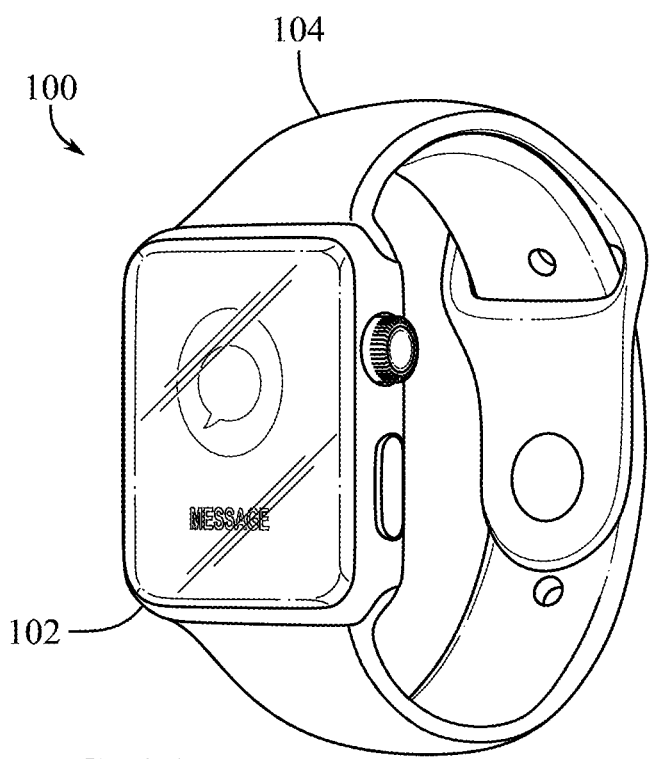
FIG. 1A shows a perspective view of a portable electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Portable electronic devices can utilize electronic components having one or more membranes, such as, speakers, microphones, barometric vents, etc. For example, a barometric vent can include a porous membrane which enables pressure within a housing of the portable electronic device to equalize to a pressure outside of the housing (e.g., the pressure of an ambient environment in which the portable electronic device is exposed). Environmental attributes, such as, temperature, humidity, air-born contaminants, elevation, and/or atmospheric pressure resultant of submersion within a liquid can vary the pressure exerted onto the device. Fluctuations in relative pressure can degrade the membrane or otherwise cause the device to perform poorly. For example, when exposed to a load or force, the membrane can stretch or otherwise undergo an inelastic or plastic deformation.

Accordingly, supporting the membrane to prevent or reduce inelastic or plastic deformation can be desirable to maintain sufficient equalization of pressure (i.e., enable sufficient fluid flow through the membrane to sufficiently equalize pressure). One option for supporting the membrane, utilizes a stiffener which spans adjacent the membrane and contacts the membrane. However, such stiffeners require multiple large through-holes formed along a length of the stiffener to enable sufficient fluid flow through the stiffener. Consequently, the membrane can be biased into the through-holes with such force that the membrane is permanently deformed (stretched by the through-holes) and thereafter provides diminished fluid flow. In other words, the membrane can be permanently deformed such that portions of the membrane contact a periphery of each through-hole and act as a seal such that fluid flow through the membrane is limited to only the portions of the membrane which align with the through-holes (as opposed to an entirety of the membrane). Moreover, the relatively large diameter and linearity of the through-holes within the stiffener expose the portable electronic device to ingress of contaminants, such as, dust, sand, debris, fluid, corrosive materials, and other types of organic and inorganic materials which can pass through the stiffener and into the housing.

The present disclosure relates to examples of venting modules that maintain sufficient fluid flow when the portable electronic device is utilized within high pressure environments (e.g., underwater, at elevation, etc.). In examples, the venting module can have a fluid permeable member or porous member which, together with a fluid permeable layer or membrane, defines a fluid path extending a width and/or a length of the porous member and placing an internal volume of a device housing in fluid communication with an ambient environment adjacent the housing. In other words, a top surface of the porous member can define a surface area (e.g., formed by a width and length of the porous member) through which fluid can flow. For example, a portable electronic device can include a housing which defines an internal volume and the portable electronic device can include a venting module, such as, a barometric vent or audio component/vent hybrid (e.g., a speaker assembly having a barometric vent built into the speaker assembly as the diaphragm). The venting module can include a fluid permeable membrane and a porous member disposed parallel to the membrane. The membrane and the porous member can define a fluid path extending a width and/or a length (e.g., surface area) of the porous member and placing the internal volume of the housing in fluid communication with an ambient environment adjacent the housing. The venting module can include a support structure coupled to the porous member.

The porous member can include a fluid permeable material having a porous structure which enables liquid or air to pass there through. The porous member can support the membrane while the membrane is biased (e.g., by a force exerted on the membrane) and also enable fluid flow through a substantial entirety of the porous member, rather than a few through-holes formed within a stiffener. For example, the porous member can be positioned adjacent the membrane such that the porous member extends substantially parallel to the membrane. While the membrane is biased to contact the porous member (e.g., biased by a differential in pressure between a pressure within the housing of the electronic device a pressure of the ambient environment outside of the housing), a substantially planar surface of the porous member can support the membrane to inhibit or reduce inelastic or plastic deformation of the membrane. Unlike a stiffener having relatively large through-holes which enable deformation of the membrane, a porous member can provide a fluid path through the entirety of the porous member without significantly deforming the membrane.

The porous member can define a fluid path that is tortuous (i.e., a fluid path that takes a non-linear route through the porous member). A tortuous fluid path formed within the porous member can be beneficial, for example, by including inherent obstacles (e.g., twists and turns) in the fluid path which trap or limit movement of contaminants along the fluid path. While the fluid path is described as a singular path extending through the membrane and porous member, those having skill in the art will readily appreciate the fluid path defined by the membrane and porous member can include many variable fluid paths extending and winding through the porous structure of the porous member. As such, the porosity of the porous member can inherently define a fluid path having numerous redundancies such that the elimination of a particular fluid path (e.g., the particular fluid path is occluded by a contaminant) does not substantially impact a quantity of fluid which can flow along the fluid path.

These and other embodiments are discussed below with reference to FIGS. 1A-4. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1A shows an example of a portable electronic device 100. The portable electronic device 100 shown in FIG. 1A is a watch, such as a smartwatch. The smartwatch of FIG. 1A is merely one representative example of a device that can be used in conjunction with the systems and methods disclosed herein. The portable electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The portable electronic device 100 can also be referred to as an electronic device, or a consumer device. In some examples, the portable electronic device 100 can include a housing 102 that can carry operational components, for example, in an internal volume at least partially defined by the housing 102. The electronic device 100 can also include a strap 104, or other retaining component that can secured the device 100 to a body of a user as desired. Further details of the portable electronic device 100 are provided below with reference to FIG. 1B.

Figure 1B:
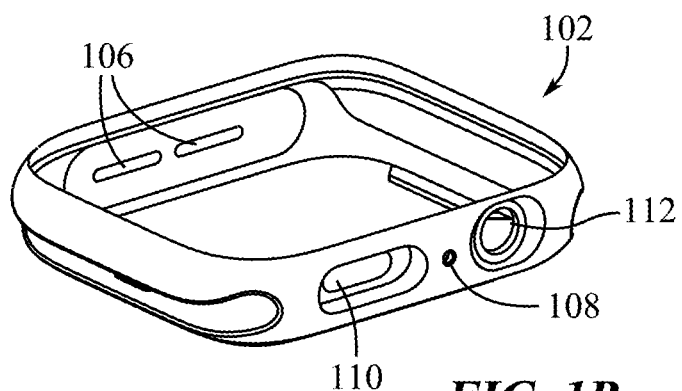
FIG. 1B shows a perspective view of a housing of the portable electronic device of FIG. 1A.

FIG. 1B shows the housing 102 depicted in FIG. 1A. The housing 102 can be a substantially continuous or unitary component, and can define one or more openings 106, 108, 110, 112 to receive components of the portable electronic device 100 and/or to provide access to an internal portion of the electronic device 100. For example, one or more of the openings 106, 108, 110, 112 can provide fluid communication between an ambient environment outside of the housing 102 and one or more internal volumes within the housing 102 and/or electronic components disposed within the housing 102. The electronic components can be disposed within the internal volume defined at least partially by the housing 102, and can be affixed to the housing 102 via adhesives, internal surfaces, attachment features, threaded connectors, studs, posts, or other features, that are formed into, defined by, or otherwise part of the housing 102 and/or a cover and/or back cover of the portable electronic device 100.

Figure 1C:
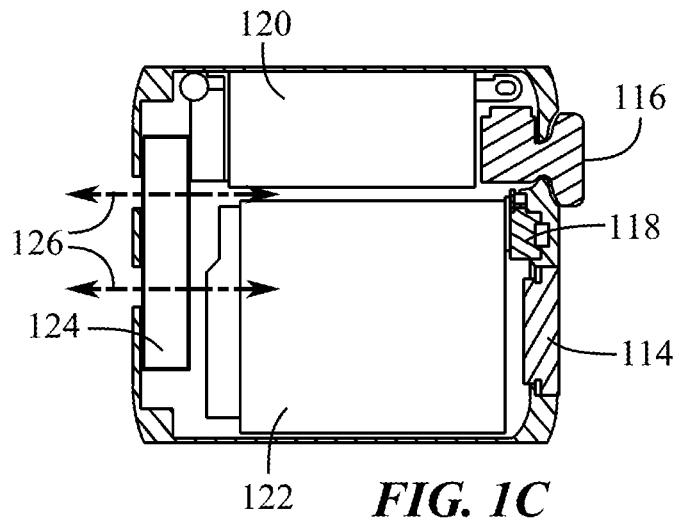
FIG. 1C shows a cross-sectional top view of the portable electronic device of FIG. 1A.

FIG. 1C shows a top cross-sectional view of the portable electronic device 100 depicted in FIG. 1A. In some examples, the device 100 can include input components such as one or more buttons 114 and/or a crown 116 that can be disposed in the openings 110, 112. A microphone assembly 118 can be disposed in the internal volume in communication with the external or ambient environment through the opening 108. Other electronic components can be disposed within the internal volume of the housing 102, for example, a haptic feedback module 120 and a battery 122. A barometric vent or venting module 124 can be disposed in the internal volume in communication with the external or ambient environment through the openings 106. In some examples, the venting module 124 can be built into an audio component, such as, a speaker assembly. For example, the venting module 124 can be part of a diaphragm of the speaker assembly.

While this disclosure only references a few specific electronic components of the portable electronic device 100, those skilled in the art will appreciate the portable electronic device can include any number or variety of electronic components can be included in the portable electronic device 100. For example, the portable electronic device 100 can include a display, a main logic board having a system in package (SiP), one or more antennas, wireless communication circuits, a camera, a second logic board, one or more sensors, and/or any other electronic component.

One or more of the electronic components disposed within the portable electronic device 100 can include a membrane and a porous member (see FIGS. 2-4) which define a fluid path to equalize a pressure within the internal volume of the portable electronic device 100 and thereby enables satisfactory operation of the portable electronic device. The porous member can act as a support to the membrane and prevent or reduce damage to the membrane, such as, inelastic or plastic deformation caused by forces on the membrane. The porosity of the porous member can enable fluid flow. For example, the venting module 124 can include a membrane and a porous member which define a fluid path between the internal volume of the housing 102 and the ambient environment adjacent the housing 102 (as illustrated by arrows 126 in FIG. 1C).

Any number or variety of components in any of the configurations described herein can be included in the portable electronic device. The components can include any combination of the features described herein and can be arranged in any of the various configurations described herein. The structure and arrangement of components of a portable electronic device having a housing with structures described herein, and defining an internal volume, as well as the concepts regarding membranes, porous members, and fluid paths, can apply not only to the specific examples discussed herein, but to any number of embodiments in any combination. An example embodiment of a venting module of a portable electronic device including components having various features in various arrangements are described below, with reference to FIG. 2.

Figure 2:
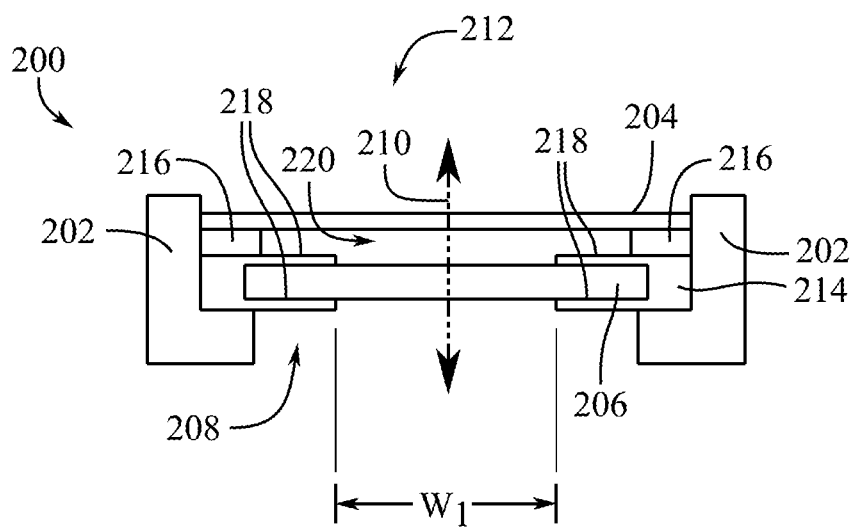
FIG. 2 shows a cross-sectional side view of a venting module.

FIG. 2 shows a cross-sectional side view of a venting module 200. The venting module 200 can be part of an electrical component within a portable electronic device, such as, a barometric vent or a speaker assembly. The venting module 200 can include a support structure 202, a membrane 204, and a porous member 206. In some examples, the support structure 202 can form an aperture 208 and one or more of the membrane 204 and the porous member 206 can be disposed within the aperture 208. For example, the membrane 204 and the porous member 206 can span the aperture 208. The membrane 204 and the porous member 206 can define a fluid path (as illustrated by arrow 210) spanning a width $W_1$ and a length (see length L in FIG. 3B) of the porous member 206 and placing an internal volume of a housing (not shown) in fluid communication with an ambient environment 212 adjacent the housing. In other words, a cross-section of the fluid path can include a surface area of the porous member that is defined by a width and length of the porous member.

In some examples, the porous member 206 can be molded or otherwise coupled to a mount 214. The mount 214 can be coupled to the support structure 202 and retain the porous member 206 within the aperture 208. The mount 214 and the porous member 206 can be coupled or otherwise affixed together using one or more of adhesives, molding, welding, fasteners, or a combination thereof. For example, the mount 214 can be overmolded onto the porous member 206 and include overmolded portions 218 interfacing with the porous member 206. The mount 214 can be subsequently coupled to the support structure 202 using an adhesive. The mount 214 can include metals, metal alloys, polymers, ceramics, or a combination thereof.

The porous member 206 can include metals, metal alloys, polymers, ceramics, or combinations thereof. In some examples, the porous member 206 can include nickel and/or titanium. The porous member 206 can be a metal foam having a porosity of at least 30%, between about 30% and about 40%, between about 40% and about 50%, between about 50% and about 70%, or less than about 80%. Additionally, or alternatively, the porous member 206 can have a stiffness of at least 50 megapascal (MPa), between about 50 MPa and about 100 MPa, between about 100 MPa and about 200 MPa, between about 200 MPa and about 300 MPa, or less than 500 MPa.

The membrane 204 can be porous or otherwise configured such that fluid can bi-directionally flow through the membrane 204. The membrane 204 can be disposed within and/or over the aperture 208 of the support structure 202. For example, the membrane 204 can be adhered or otherwise affixed to the porous member 206 and/or the mount 214. In some examples, the membrane 204 can be affixed to the mount 214 with an adhesive 216, such as, a heat activated film (HAF). The relative position of the membrane 204 with respect to the porous member 206 can define a gap 220. The gap 220 can provide space in which the membrane 204 can elastically deform (i.e., non-permanently deform) before the membrane 204 contacts one or more of the mount 214 and the porous member 206. The gap 220 can be at least 10 microns, between about 10 microns and about 25 microns, between about 25 microns and about 50 microns, or less than about 75 microns. While the venting module 200 illustrated in FIG. 2 includes a gap 220 between the membrane 204 and the porous member 206, those having skill in the art will readily appreciate that other examples of venting modules may not include a gap between the membrane and the porous member. For example, the membrane can be directly affixed to a surface of the porous member such that no gap is formed between the membrane and the porous member.

Any number or variety of components in any of the configurations described herein can be included in the portable electronic device. The components can include any combination of the features described herein and can be arranged in any of the various configurations described herein. The structure and arrangement of components of a portable electronic device having a housing with structures described herein, and defining an internal volume, as well as the concepts regarding membranes, porous members, and fluid paths, can apply not only to the specific examples discussed herein, but to any number of embodiments in any combination. Examples of venting modules of a portable electronic device including components having various features in various arrangements are described below, with reference to FIGS. 3A-3F.

Figure 3A:
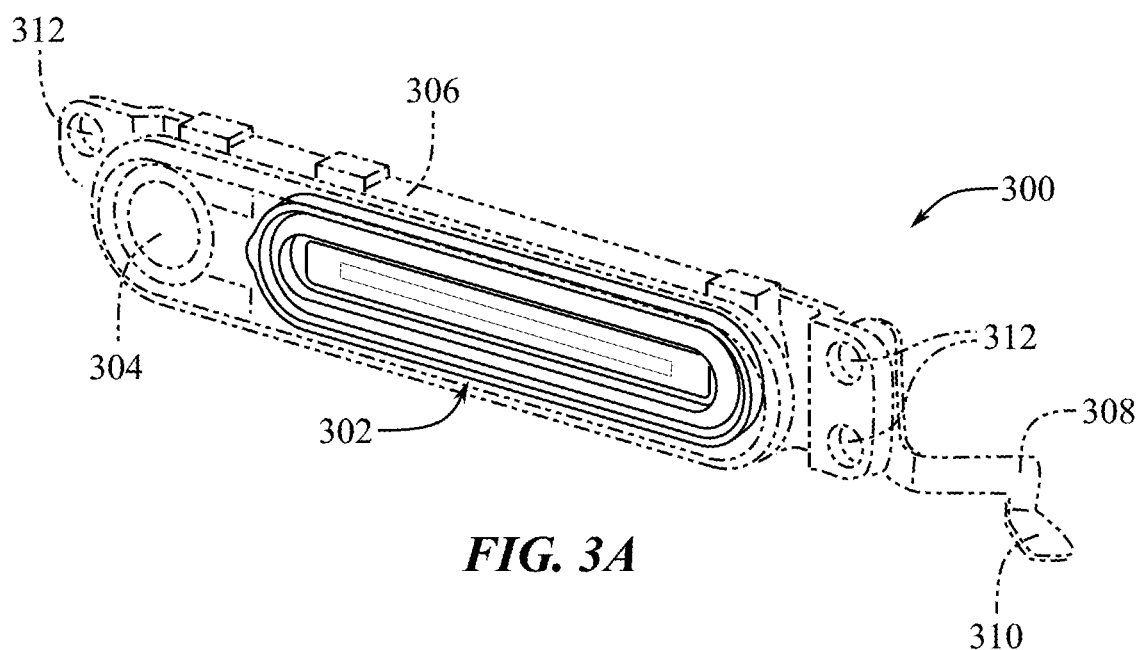
FIG. 3A shows a perspective side view of a speaker assembly including a venting module.

FIG. 3A shows a perspective side view of a speaker assembly 300 including a venting module 302, a sensor 304, a frame 306, and a flexible connector 308 having a connection point 310. The flexible connector 308 and the connection point 310 can be communicatively coupled the speaker assembly 300 to a logic board (not shown) or other component of a portable electronic device. The speaker assembly 300 can include one or more sensors or operational components that may have reason to communicate with the ambient environment, such as the sensor 304. In some examples, the sensor 304 can be a pressure sensor module to detect or otherwise measure data relating to a pressure of the ambient environment and/or a pressure within the housing relative to the pressure of the ambient environment. The frame 306 can include attachment features 312 for affixing the speaker assembly 300 to the housing (e.g., housing 102), and that can further seal against the housing to provide a barrier to the ingress of liquid or contaminants into the internal volume of the housing. Additionally, or alternatively, the frame 306 can provide structural support to the speaker assembly 300 to substantially prevent flexure or deformation of the speaker assembly 300 under applied loads (e.g., submersion within a liquid or other environment that would result in a high load or force being applied to the speaker assembly 300).

The venting module 302 can be substantially similar to and include some or all of the features of other venting modules disclosed herein, for example, the venting module 200. The venting module 302 will be discussed in more detail below with reference to FIGS. 3B-3F.

Figure 3B:
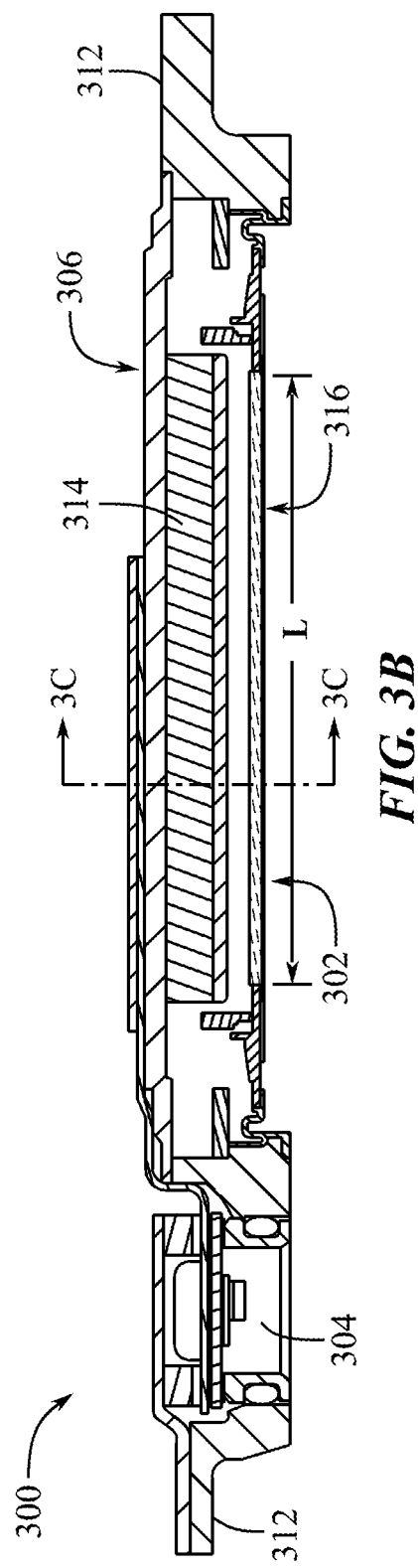
FIG. 3B shows a cross-sectional side view of the speaker assembly of FIG. 3A.

FIG. 3B shows a cross-sectional side view of the speaker assembly 300 shown in FIG. 3A. The speaker assembly 300 can include one or more components that enable the speaker assembly 300 to output sound. For example, the speaker assembly can include one or more magnets 314 and a diaphragm 316 disposed adjacent the magnet 314. The one or more magnets 314 can be used to drive the diaphragm 316 to produce acoustic signals or sounds. The one or more magnets 314 can include any desired magnetic material and can be permanent, semi-permanent, or electromagnets, as desired. The diaphragm 316 will be discussed in more detail below with reference to FIGS. 3C-3F.

Figure 3C:
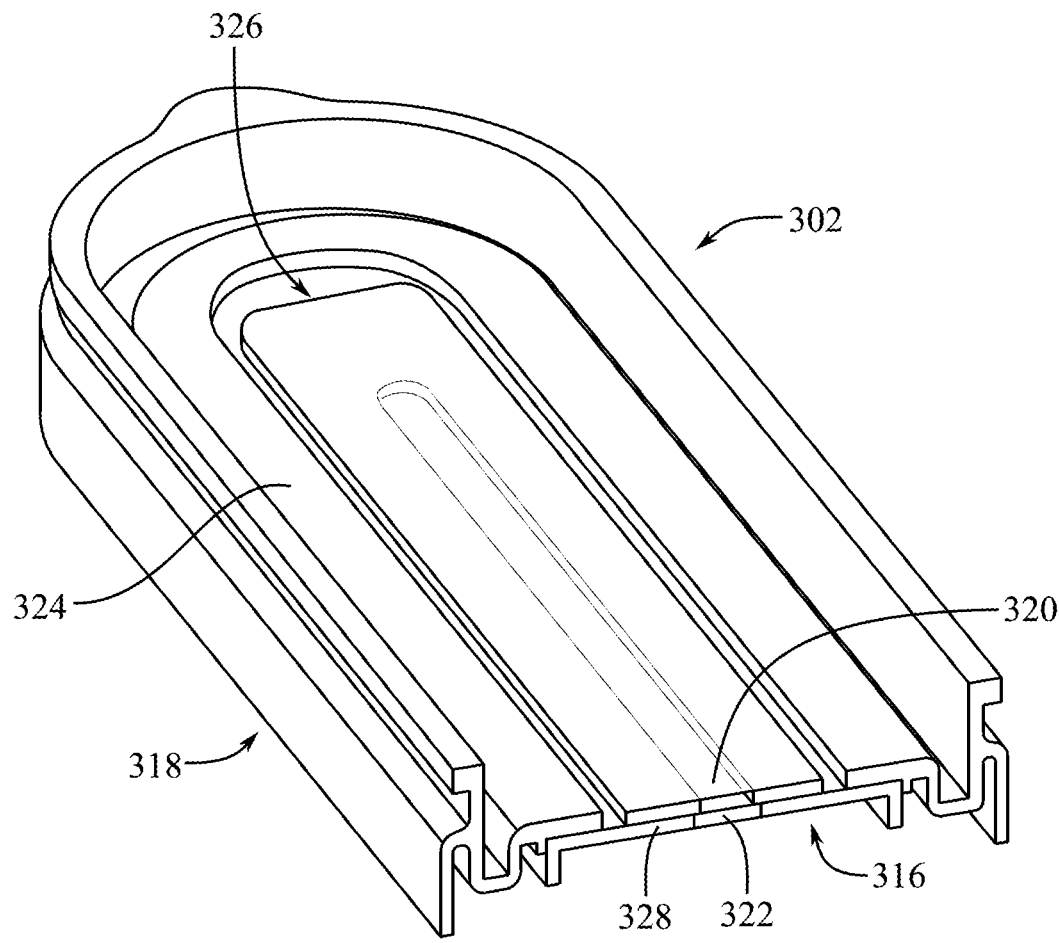
FIG. 3C shows a perspective cross-sectional view of the venting module of FIG. 3A.

FIG. 3C shows a perspective cross-sectional view of the venting module 302 of the speaker assembly 300 shown in FIG. 3A. The venting module 302 can include the diaphragm 316 and a support structure 318. The diaphragm 316 can include a membrane 320 and a porous member 322. The support structure 318 can include a planar portion 324 which defines an aperture 326 and the diaphragm 316 (i.e., the membrane 320 and porous member 322) can be at least partially disposed within the aperture 326. For example, the membrane 320 and the porous member 322 can span at least a portion of the aperture 326. The membrane 320 and the porous member 322 can define a fluid path extending a width and length (see length L in FIG. 3B) of the porous member 322. The length L and width $W_1$ can define a surface area of a surface of the porous membrane through which fluid can flow. The fluid path can place an internal volume of a housing (not shown) in fluid communication with an ambient environment adjacent the housing (see FIG. 1C).

In some examples, the venting module 302 can include a mount 328. The porous member 322 can be molded or otherwise coupled to the mount 328. The mount 328 can be coupled to the support structure 318 at the planar portion 324 and retain the porous member 322 within the aperture 326. The mount 328 and the porous member 322 can be coupled or otherwise affixed together using one or more of adhesives, molding, welding, fasteners, or a combination thereof. For example, the mount 328 can be overmolded onto the porous member 322 and include overmolded portions 330 interfacing with the porous member 322 (see FIGS. 3D-3E). The mount 328 can be subsequently coupled to the support structure 318, for example, using an adhesive. According to one example, the mount 328 can serve as a stiffener to support the membrane 320 when the venting module 302 is subject to a high pressure environment.

The membrane 320 can be substantially similar to and include some or all of the features of other membranes disclosed herein, for example, the membrane 204. The membrane 320 can be porous or otherwise configured such that fluid can bi-directionally flow through the venting module 302. The membrane 320 can be disposed within and/or over the aperture 326 of the support structure 318. For example, the membrane 320 can be adhered or otherwise affixed to the porous member 322 and/or the mount 328. In some examples, the membrane 320 can be affixed to the mount 328 with an adhesive 332, such as, a heat activated film (HAF).

Figure 3D:
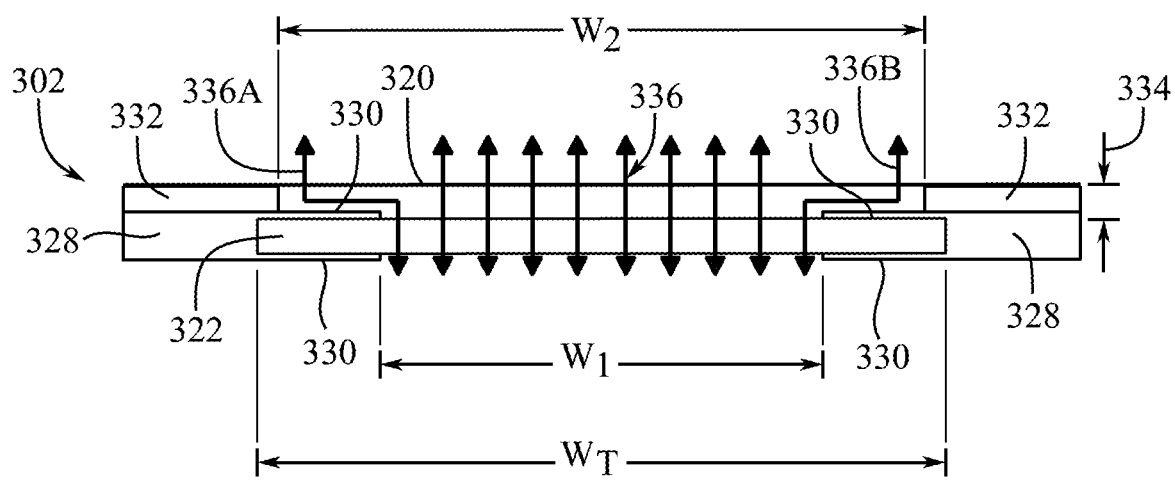
FIG. 3D shows a cross-sectional side view of the venting module of FIG. 3A in a pre-biased state.

FIG. 3D shows a cross-sectional side view of the venting module 302 of FIG. 3A including the membrane 320 in a pre-biased state. In other words, the membrane 320 is positioned as if there is no force or load being placed on the membrane 320 to bias the membrane 320 into contact with the porous member 322. For example, the membrane 320 can be in the pre-biased state when the pressure on each side of the venting module is equivalent (i.e., when an absolute pressure within the housing of the portable electronic device is equal to the absolute pressure of the ambient environment outside of the housing). In the pre-biased state, the membrane 320 can enable fluid (e.g., air, water, etc.) to flow through a width $W_1$ of the porous member 322 (as illustrated by arrows 336). The width $W_1$ can span or extend across the total width $W_T$ of the porous member 322 or a portion thereof. While the width $W_1$ of the porous member 322 that permits fluid flow is less than the total width $W_T$ in FIG. 3D, those skilled in the art will readily appreciate that the width $W_1$ can extend the total width $W_T$ of the porous member 322 in other examples. For example, the venting module 302 can be devoid of the mount 328. In this example, the porous member 322 can be directly coupled to the support structure 318 to enable fluid flow across the total width $W_T$ of the porous member 322 or a greater width of the porous member 322.

The relative position of the membrane 320 with respect to the porous member 322 can define a gap 334. The gap 334 can provide space in which the membrane 320 can be biased before the membrane 320 contacts one or more of the mount 328 and/or the porous member 322. The gap 334 can be at least 10 microns, between about 10 microns and about 25 microns, between about 25 microns and about 50 microns, or less than about 75 microns. In some examples, the gap 334 can enable fluid flow through portions of the membrane 320 which would otherwise be prevented from fluid flow without the gap 334. For example, air and other fluids can flow through portions of the membrane 320 which are not disposed directly over the porous member 322. As illustrated by arrows 336A and 336B, fluid can flow through portions of the membrane 320 disposed adjacent fluid impermeable material (e.g., the mount 328) and still flow through the porous member 322. As such, a width $W_2$ of the membrane 320 which can provide fluid flow is greater than the width $W_1$ of the porous member 322 which can provide fluid flow. Thus, a relatively greater quantity of fluid can flow through the venting module 302. If the membrane 320 were in direct contact with a fluid impermeable material (e.g., the mount 328), fluid can be inhibited or prevented from flowing through the portions of the membrane 320 in direct contact with the fluid impermeable material (see FIG. 3E).

Figure 3E:
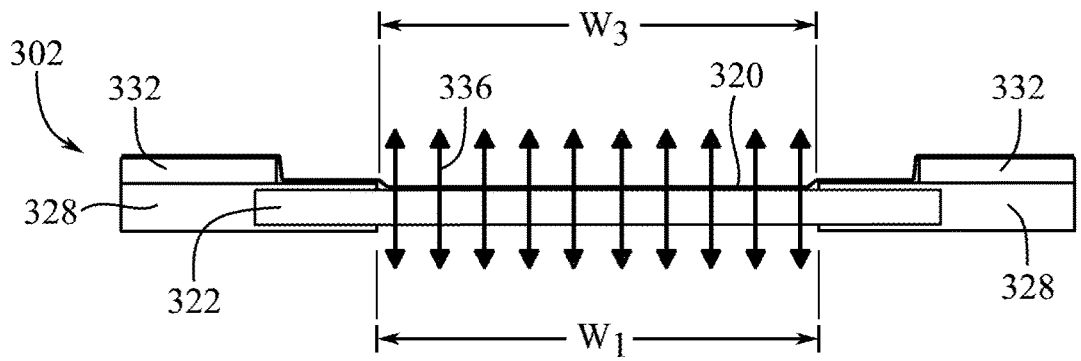
FIG. 3E shows a cross-sectional side view of the venting module of FIG. 3A in a biased state.

FIG. 3E shows a cross-sectional side view of the venting module 302 of FIG. 3A including the membrane 320 in a biased state (e.g., when the venting module 302 is in a high pressure environment). In other words, the membrane 320 is positioned as if there is a force or load being placed on the membrane 320 that biases the membrane 320 into contact with the porous member 322 and the mount 328 to eliminate the gap 334 between the membrane 320 and the porous member 322. As illustrated by the arrows 336, fluid can still flow through the width $W_1$ of the porous member 322 while the membrane 320 is in the biased state. Thus, the venting module 302 can continue to provide sufficient fluid flow even when the membrane 320 is under a load. Unlike the example of a stiffener having through-holes described above, contact by the membrane 320 does not significantly impact or reduce the ability of fluid to flow through the venting module 302 because the porous member 322 enables fluid to flow through a significant portion (e.g., width $W_1$) of the porous member 322, as opposed to a minor portion of the stiffener (e.g., the through-holes).

In some examples, fluid cannot flow through the portions of the membrane 320 which contact a fluid impermeable material (e.g., the mount 328). As such, while the membrane 320 is biased into contacting the porous member 322, a width $W_3$ of the membrane 320 which can provide fluid flow is equivalent to the width $W_1$ of the porous member 322 which can provide fluid flow. As the load or force which biases the membrane 320 into contacting the porous member 322 is reduced, a width of the membrane 320 which can provide fluid flow can increase to be greater than the width $W_1$ of the porous member 322 which can provide fluid flow (see FIG. 3F).

Figure 3F:
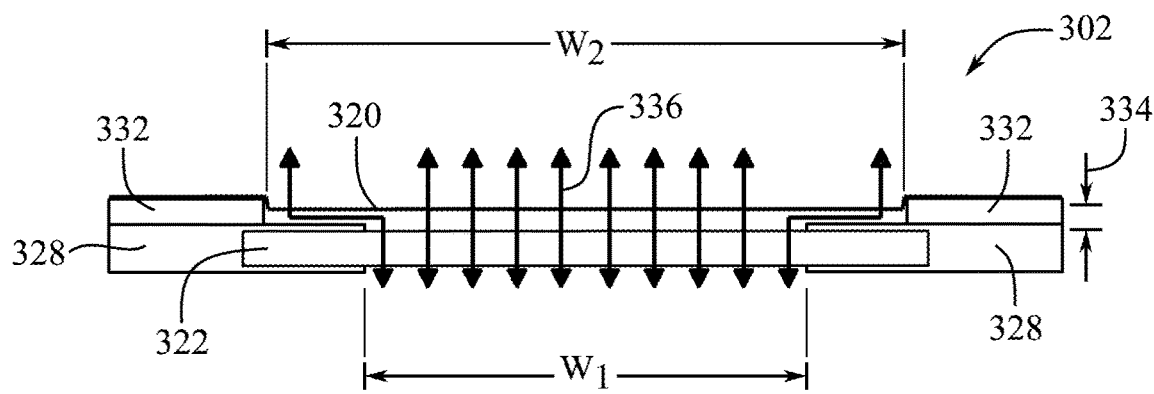
FIG. 3F shows a cross-sectional side view of the venting module of FIG. 3A in a post-biased state.

FIG. 3F shows a cross-sectional side view of the venting module 302 of FIG. 3A including the membrane 320 in a post-biased state. In other words, the membrane 320 is positioned as if the force or load placed on the membrane 320 which biased the membrane 320 into contact with the porous member 322 (as depicted in FIG. 3E) has been reduced or eliminated. For example, a user of a portable electronic device including the venting module 302 may have brought the device out of a body of water (e.g., surfaced the device from a pool or lake). Alternatively, or additionally, the venting module 302 may have equalized or partially equalized the pressure differential between the interior volume of the portable electronic device and the ambient environment in which the portable electronic device was exposed. As such, the membrane 320 can at least partially return to an initial position (shown in FIG. 3D) such that the membrane 320 is displaced from the porous member 322 to form the gap 334 between the membrane 320 and the porous member 322.

In some examples, the membrane 320 can experience plastic or inelastic deformation such that the membrane 320 does not fully return to the initial position shown in FIG. 3D.

Nevertheless, the gap 334 can enable the membrane 320 to provide fluid flow through the width $W_2$ of the membrane 320. As illustrated by arrows 336A and 336B, fluid can still flow through portions of the membrane 320 disposed adjacent fluid impermeable material (e.g., the mount 328) and can still flow through the width $W_1$ of the porous member 322.

Figure 4:
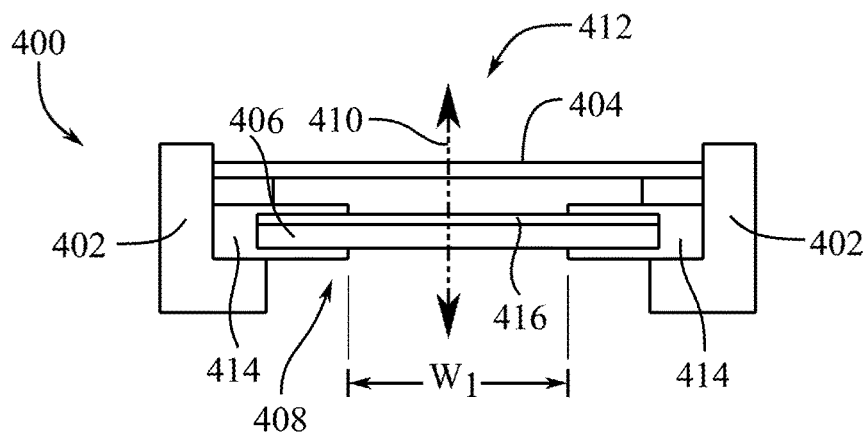
FIG. 4 shows a cross-sectional side view of a venting module.

FIG. 4 shows a cross-sectional side view of a venting module 400. The venting module 400 can be part of an electrical component within a portable electronic device, such as, a barometric vent or a speaker assembly. The venting module 400 can include a support structure 402, a membrane 404, and a porous member 406. In some examples, the support structure 402 can form an aperture 408 and one or more of the membrane 404 and the porous member 406 can be disposed within the aperture 408. For example, the membrane 404 and the porous member 406 can span the aperture 408. The membrane 404 and the porous member 406 can define a fluid path (as illustrated by arrow 410) extending a width $W_1$ of the porous member 406 and placing an internal volume of a housing (not shown) in fluid communication with an ambient environment 412 adjacent the housing.

The support structure 402 can be substantially similar to and include some or all of the features of other support structures disclosed herein, for example, support structure 202. The membrane 404 can be can be substantially similar to and include some or all of the features of other membranes disclosed herein, for example, membranes 204, 320. In some examples, the porous member 406 can be molded or otherwise coupled to a mount 414. The mount 414 can be coupled to the support structure 402 and retain the porous member 406 within the aperture 408.

The porous member 406 can be treated or otherwise include a material 416 which renders the porous member 406 at least one of hydrophobic, oleophobic, or corrosion-resistant. For example, the porous member 406 can include a polytetrafluoroethylene (PTFE) which renders the porous member hydrophobic and corrosion-resistant. The material 416 can be deposited on one or more surfaces of the porous member 406. In some examples, the material 416 can extend through the porous member 406 as opposed to being deposited on a surface of the porous member 406. Additionally, or alternatively, the porous member 406 can be manufactured from a material that is hydrophobic, oleophobic, or corrosion-resistant. For example, the porous member 406 can be made of a corrosion-resistant titanium or nickel based metal foam.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device, comprising:
a housing defining an internal volume;
a venting module in fluid communication with the internal volume, the venting module comprising:
a support structure;
a membrane; and
a porous member disposed relative to the membrane, the membrane and the porous member defining a fluid path, the porous member coupled to a mount that extends from the support structure into the fluid path, the mount retaining the porous member in the fluid path, a cross-section of the fluid path comprising a surface area of the porous member that is defined by a width and a length of the porous member, the fluid path extending from the internal volume to an environment external to the housing.

2. The electronic device of claim 1, wherein the fluid path comprises a tortuous path.

3. The electronic device of claim 1, wherein the membrane and the porous member define a gap.

4. The electronic device of claim 3, wherein the gap is between 10 microns and 50 microns.

5. The electronic device of claim 1, wherein the porous member comprises at least one of a metal, a metal alloy, a polymer, or a ceramic.

6. The electronic device of claim 5, wherein the porous member comprises at least one of titanium or nickel.

7. The electronic device of claim 5, wherein the porous member comprises a metal foam.

8. The electronic device of claim 1, wherein:
a portion of the fluid path extending through the porous member comprises a tortuous path;
the fluid path spans the width and a length of the porous member;
the venting module further comprises a mount coupled to the porous member;
the membrane is affixed to the mount using a heat activated film;
the venting module further comprises a support structure coupled to the porous member;
the electronic device further comprises a pressure sensor; and
the electronic device further comprises a display.

9. The electronic device of claim 1, wherein:
the porous member defines a surface; and
the surface is at least one of hydrophobic, oleophobic, or corrosion-resistant.

10. The electronic device of claim 1, wherein the porous member has a stiffness between 100 megapascal (MPa) and 300 MPa.

11. The electronic device of claim 1, wherein the porous member has a porosity between 40% and 60%.

12. A speaker assembly, comprising:
a frame;
a support structure coupled to the frame and defining an aperture;
a magnet affixed to the frame; and
a diaphragm positioned within the aperture, the diaphragm comprising:
a porous membrane; and
a porous member disposed relative to the porous membrane, the porous membrane coupled to a mount, wherein:
the porous member comprises a surface having a length and a width defining a surface area; and
the porous membrane and the porous member define a fluid path extending through the surface, the mount extending from the support structure into the fluid path the mount retaining the porous member in the fluid path, wherein a cross-section of the fluid path equal to the a surface area of the porous member.

13. The speaker assembly of claim 12, wherein the fluid path comprises a tortuous path.

14. The speaker assembly of claim 12, wherein the width of the porous member is less than a width of the porous membrane.

15. The speaker assembly of claim 12, wherein:
the diaphragm further comprises a mount coupled to the support structure; and
the diaphragm spans at least a portion of the aperture.

16. The speaker assembly of claim 15, wherein the mount is overmolded to the porous member.

17. A venting module, comprising:
a fluid permeable layer;
a fluid permeable member disposed parallel to the fluid permeable layer, the fluid permeable layer and the fluid permeable member defining a non-linear fluid path;
a mount extending into the fluid path to retain the porous member in the fluid path; and
a support structure coupled to the mount.

18. The venting module of claim 17, wherein the fluid permeable member comprises a metal.

19. The venting module of claim 18, wherein the fluid permeable member comprises at least one of titanium or nickel.

20. The venting module of claim 17, wherein the fluid permeable member has a stiffness between 100 megapascal (MPa) and 300 MPa.

\* \* \* \* \*